United States Patent
Dawson et al.

[11] Patent Number: 6,096,639
[45] Date of Patent: Aug. 1, 2000

[54] METHOD OF FORMING A LOCAL INTERCONNECT BY CONDUCTIVE LAYER PATTERNING

[75] Inventors: Robert Dawson, Austin; Mark I. Gardner, Cedar Creek; Frederick N. Hause; H. Jim Fulford, Jr., both of Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 09/056,835

[22] Filed: Apr. 7, 1998

[51] Int. Cl.[7] .................................................. H01L 21/4763
[52] U.S. Cl. ........................ 438/649; 438/233; 438/621; 438/651; 438/655; 438/683
[58] Field of Search ..................... 438/649, 233, 438/651, 655, 664, 682, 683, 621, 618

[56] References Cited

U.S. PATENT DOCUMENTS

| | | | |
|---|---|---|---|
| 4,378,628 | 4/1983 | Levinstein et al. | 427/88 |
| 5,094,981 | 3/1992 | Chung et al. | 438/621 |
| 5,190,893 | 3/1993 | Jones, Jr. et al. | |
| 5,227,325 | 7/1993 | Gonzalez | 438/305 |
| 5,266,156 | 11/1993 | Nasr | |
| 5,439,835 | 8/1995 | Gonzalez | 438/302 |
| 5,516,726 | 5/1996 | Kim et al. | |

FOREIGN PATENT DOCUMENTS

| | | |
|---|---|---|
| 0572214A2 | 12/1993 | European Pat. Off. |
| 2 717 006 | 9/1995 | France |
| 19535101A1 | 5/1996 | Germany |

*Primary Examiner*—Charles Bowers
*Assistant Examiner*—Thanh Nguyen
*Attorney, Agent, or Firm*—Skjerven, Morrill, MacPherson, Franklin, & Friel LLP

[57] ABSTRACT

A local interconnect (LI) structure is formed by forming a silicide layer in selected regions of a semiconductor structure then depositing an essentially uniform layer of transition or refractory metal overlying the semiconductor structure. The metal local interconnect is deposited without forming in intermediate insulating layer between the silicide and metal layers to define contact openings or vias. In some embodiments, titanium a suitable metal for formation of the local interconnect. Suitable selected regions for silicide layer formation include, for example, silicided source/drain (S/D) regions and silicided gate contact regions. The silicided regions form uniform structures for electrical coupling to underlying doped regions that are parts of one or more semiconductor devices. In integrated circuits in which an etchstop layer is desired for the patterning of the metal film, a first optional insulating layer is deposited prior to deposition of the metal film. In one example, the insulating layer is a silicon dioxide (oxide) layer that is typically less than 10 nm in thickness.

18 Claims, 3 Drawing Sheets

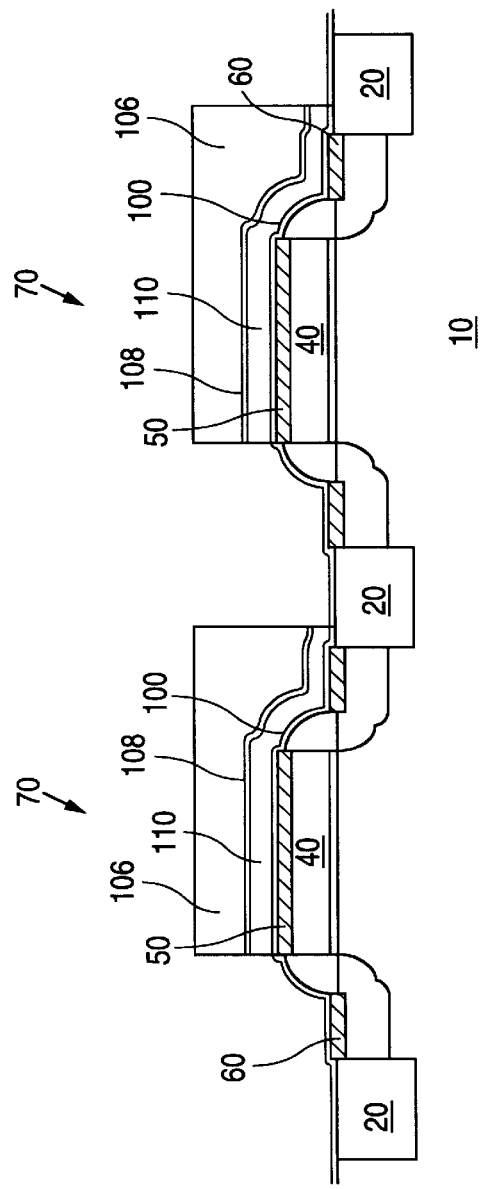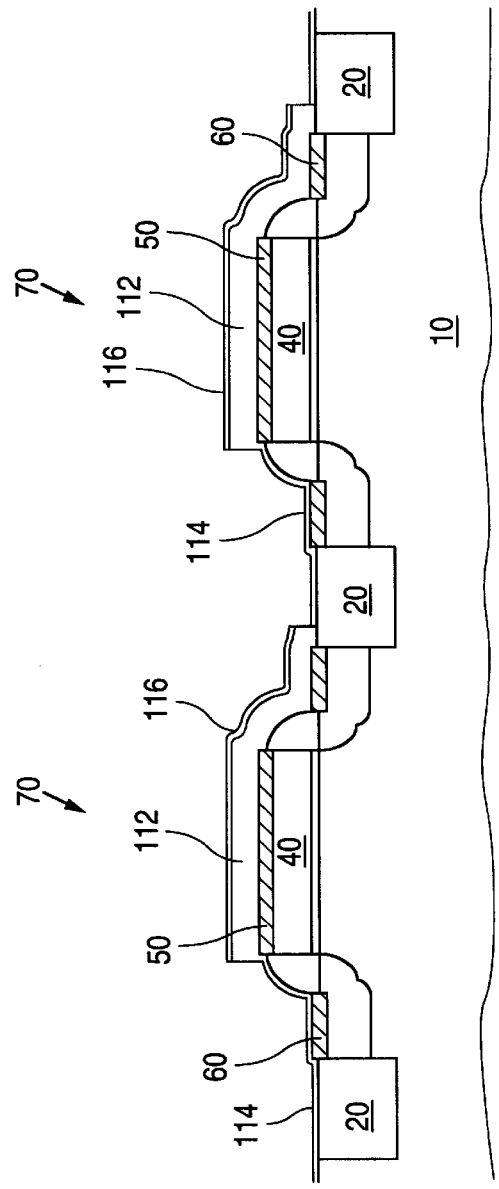

METHOD OF FORMING A LOCAL INTERCONNECT BY CONDUCTIVE LAYER PATTERNING

BACKGROUND OF THE INVENTION

1. Field of the Invention

The present invention relates in general to semiconductor integrated circuit device structures and associated methods of fabrication. More specifically, the present invention relates to a method for forming a local interconnect in an integrated circuit device.

2. Description of Related Art

Semiconductor integrated circuits (ICs) and associated fabrication methods are continuing and important areas of research and development. One significant area of focus for research and development investigation is the formation of local interconnect structures. Local interconnects are routing-restricted electrical interconnects that are typically used within a functional cell of an integrated circuit for various purposes such as electrically connecting a gate and drain of a transistor. Unlike other metal layers that are used for electrical coupling or contact, local interconnect structures are constructed without formation of an underlying insulating layer with etched contact openings that allows precise control of areas of electrical connection and electrical insulation. Thus local interconnect structures are not formed that extend across a region without electrically coupling to that region. For example, a local interconnect structure is not formed that extends across a gate region without electrically coupling to the gate region.

Throughout the history of semiconductor process technology, various methods for forming local interconnect structures have been developed. In some conventional integrated circuit fabrication methods, heavily-doped polysilicon is used as a local interconnect material. In other integrated circuit fabrication techniques, a polysilicon layer having a metal silicide layer is a suitable interconnect material. One disadvantage of a metal silicide interconnect layer is that the polysilicon layers are typically N-type doped layers that are unsuitable for forming electrical contacts to source/drain (S/D) regions of PMOS devices. More recently, other local interconnect methods have been devised including selective formation of $TiSi_2$, Ti:W over $CoSi_2$ and TiN over $TiSi_2$. While each interconnect formation scheme has advantages over the usage of a polysilicon layer, each scheme also has process limitations that restrict wide-spread usage.

For example, a selective $TiSi_2$ formation method employs a reaction of titanium (Ti) metal with silicon (Si) to form a silicide. A titanium (Ti) layer is deposited. Then an amorphous silicon (Si) layer or film is formed. The silicon film is patterned and the sample is heated so that silicide ($TiSi_2$) is formed in regions of amorphous silicon after patterning of the silicon. (The silicide ($TiSi_2$) formation is selective to the patterned Si layer.) Any unreacted titanium is removed in a final etch. The silicide formation process has several disadvantages. First, etching the amorphous silicon overlying the titanium layer utilizes an etch process that has a high selectivity of silicon over titanium. An etch process with high selectivity to silicon over titanium is difficult to attain. The selectivity problem of the process creates a second problem, a difficulty in removing excess silicon from gate edges. Local interconnects are not easily formed using the silicide formation process and etch difficulties results in unintended electrical contacts to undesired areas, thereby reducing reliability of the integrated circuit.

Another conventional technique for forming local interconnects is described by S. Wolfe in *Silicon Processing for the VLSI Era, Volume* 2, (1990), pp. 166–67. A layer of titanium is deposited followed by a first anneal to form a TiN layer. $TiSi_2$ regions are formed essentially simultaneously. In a subsequent step, the TiN is patterned and etched to form intended local interconnect structures. A second anneal reduces sheet resistivities of the TiN layer and $TiSi_2$ regions to desired levels. One disadvantage of the local interconnect formation method is difficulty in controlling $TiSi_2$ formation. Typically, a titanium layer is deposited so that silicide ($TiSi_2$) formation consumes the entire titanium layer. Therefore the amount of silicide that is formed and the amount of silicon that is consumed are controlled by the thickness of the titanium layer. Since the local interconnect formation technique includes formation of both silicide ($TiSi_2$) and titanium nitride (TiN) so that only a portion of the titanium layer thickness for forming the silicide while, some control method is necessary to ensure that some Ti remains for TiN formation. Therefore, unlike a typical $TiSi_2$ process, both time and temperature are controlled to regulate silicon consumption. Unfortunately, by controlling time and temperature for silicon consumption regulation creates undesirable variability in junction depths for doped areas.

Another difficulty is that the titanium nitride layer should have a uniform thickness to form suitable local interconnect structures. The formation of a uniform thickness titanium nitride layer is difficult to achieve since the rate of titanium nitride formation varies depending on the composition of materials in contact with the precursor titanium layer and depending upon whether the lower portion of the titanium layer is used to form silicide. In summary, the local interconnect formation method has several difficulties that result in unsuitable variations in resistivity and local interconnect viability.

What is needed is a technique for forming local interconnect structures that is simpler, easier to perform, lower cost, and results in more reliable local interconnect structures with lower and more consistent resistance and resistivity. What is needed is a local interconnect fabrication method that results in a more reliable local interconnect structure. What is further needed is a method for forming reliable and low resistivity local interconnect structures that is easy to perform and integrates easily into an existing integrated circuit fabrication process.

SUMMARY OF THE INVENTION

A local interconnect (LI) structure is formed by forming a silicide layer in selected regions of a semiconductor structure then depositing an essentially uniform layer of transition or refractory metal overlying the semiconductor structure. The metal local interconnect is deposited without forming an intermediate insulating layer between the suicide and metal layers to define contact openings or vias. In some embodiments, titanium is a suitable metal for formation of the local interconnect. Suitable selected regions for silicide layer formation include, for example, silicided source/drain (S/D) regions and silicided gate contact regions.

The silicided regions form uniform structures for electrical coupling to underlying doped regions that are parts of one or more semiconductor devices. In integrated circuits in which an etch-stop layer is desired for the patterning of the metal film, a first optional insulating layer is deposited prior to deposition of the metal film. In one example, the insulating layer is a silicon dioxide (oxide) layer that is typically less than 10 nm in thickness.

In some embodiments, a hard, etch-mask layer is desired so that a second optional insulating layer, such as a silicon dioxide layer, is deposited subsequent to formation of the metal film.

The metal film is patterned and etched to overlie only specific silicided regions. The metal film is typically patterned and etched using standard photolithographic processes. In some embodiments, the local interconnect structure is formed to electrically couple silicided transistor gate contacts to a silicided source or drain contact. In some embodiments, the local interconnect structure forms a common contact region for electrical coupling to a first metal layer, advantageously reducing the die surface area that would otherwise result if separate contact regions were used. In some embodiments the local interconnect structure electrically couples active integrated circuit devices to passive integrated circuit devices. One example of such an active-passive electrical connection is the coupling of a transistor to a resistor.

In some embodiments, following patterning the integrated circuit is annealed to establish a low resistance electrical contact between the local interconnect metal layer structure and individual silicided regions that are overlaid by the metal layer. In some embodiments, the anneal operation coincides with the final thermal anneal process that is typically used for forming low resistance silicided regions for coupling to the local interconnect structure. In other embodiments, the thermal anneal of the local interconnect structure is a low temperature anneal that is independent of any anneals for forming the silicided regions.

The described method for forming a local interconnect structure advantageously forms local interconnect structures that are easier to fabricate, more reliable, and have lower and more consistent resistivities than local interconnect structures that are constructed using conventional techniques.

BRIEF DESCRIPTION OF THE DRAWINGS

The present invention may be better understood, and its numerous objects, features, and advantages made apparent to those skilled in the art by referencing the accompanying drawings. For ease of understanding and simplicity, common numbering of elements within the illustrations is employed where the element is the same between illustrations.

FIGS. 1 through 4 are simplified pictorial cross-sectional plan views showing two transistors with local interconnects formed using an embodiment of method of the present invention.

DETAILED DESCRIPTION

Embodiments of the present invention are described with reference to the aforementioned figures. The drawings are simplified for ease of understanding and description of embodiments of the present invention only. Various modifications or adaptations of specific methods and or structures may become apparent to those skilled in the art as embodiments of the present invention are described. All such modifications, adaptations or variations that rely upon the teachings of the present invention, and through which these teachings have advanced the art, are considered to be within the spirit and scope of the present invention. For example, in some embodiments, shallow trench isolation regions are employed, while in other embodiments other appropriate isolation regions can be employed such as Localized Oxidation of Silicon (LOCOS) isolation regions. In another example, in some embodiments doped regions are formed with an implantation at an angle greater than an industry standard seven degrees, while in other embodiments such regions are formed with the standard angle.

Embodiments of the present invention will be described with reference to the figures. These drawings are simplified for ease of understanding and description of embodiments of the present invention only. Various modifications or adaptations of specific methods and or structures may become apparent to those skilled in the art as embodiments of the present invention are described. All modifications, adaptations or variations that rely upon the teachings of the present invention, and through which these teachings have advanced the art, are considered to be within the spirit and scope of the present invention. For example, in some embodiments, shallow trench isolation regions are employed, while in other embodiments other appropriate isolation regions can be employed, e.g. Localized Oxidation of Silicon (LOCOS) isolation regions.

Figure 1:
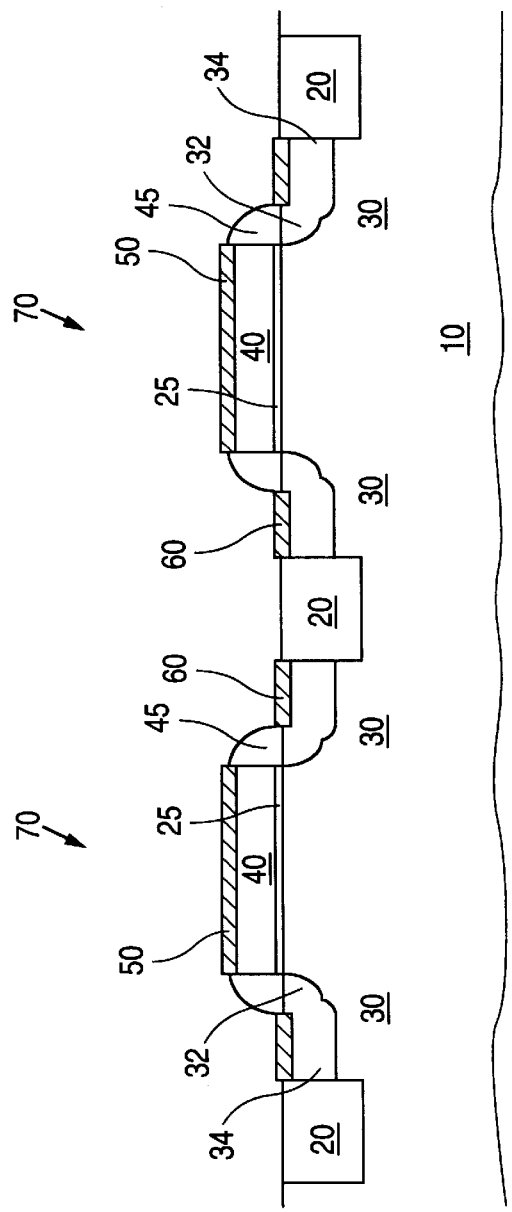

FIG. 1 is a simplified cross-sectional view of an integrated circuit showing two transistors at an intermediate stage of a fabrication process. The individual transistors 70 are formed within and on a surface of a semiconductor substrate 10. The transistors 70 are mutually isolated and isolated from other devices (not shown) formed in and on substrate 10 by shallow trench isolation regions 20. The transistors 70 have a gate electrode 40 overlying a thin gate oxide layer 25. Dielectric spacers 45 are formed adjacent to the gate electrode 40. The dielectric spacers 45 overlie a lightly doped region 32 of source/drain (S/D) regions 30. A gate silicide region 50 is formed on the gate electrode 40 and a source/drain (S/D) silicide region 60 is formed on the S/D region 30. Silicide contact regions, such as regions 50 and 60, form a uniform layer of low sheet resistance, e.g. 1–2 $\Omega$/sq. for $TiSi_2$ in comparison to 40–120 $\Omega$/sq. for a typical diff-used junction region. The silicide region advantageously promotes subsequent electrical contact to underlying doped regions or structures.

The gate electrodes 40 are typically formed of polysilicon and have a thickness appropriate to the type and purpose of transistors 70. Similarly, the gate oxide layer 25 has a suitable thickness for the type and purpose of transistors 70. For example, in some embodiments the gate electrode has a thickness of 300 nm and the gate oxide layer 25 has a thickness of about 10 nm. The dielectric spacers 45 are typically formed of silicon oxide, silicon nitride or an oxy-nitride material. Typically, the dielectric spacers 45 are formed following an implantation step to form lightly doped source/drain regions 32. The lightly doped source/drain regions 32, are self-aligned to gate electrodes 40. Subsequent to formation of the dielectric spacers 45, a second implantation is performed to form heavily-doped S/D regions 34 that complete the formation of SID regions 30. The specific process techniques that are employed to form S/D regions 30 include any techniques known in the semiconductor manufacturing arts and are design choices selected based on the specific type and purpose of transistors 70. For example in some embodiments, lightly-doped source/drain (LDD) region 32 and the heavily-doped source/drain (SD) region 34 are implanted with a suitable dose of a suitable dopant an energy in a suitable range. For example, to form NMOS transistors in active areas of the transistors 70, an N-type dopant is implanted at a suitable dosage. For example, phosphorus (P) is implanted at a dose in a range from 5E13 to 3E14 and an energy in a range from 10 kEV to 30 kEV. To form PMOS transistors in active areas of the transistors 70, a P-type dopant is implanted at a suitable dosage for LDD implant 32. For example, Boron (B) is implanted at a dose in a range from 5E13 to 3El4 and an energy in a range from 5 kEV to 20 kEV.

In alternative embodiments of the integrated circuit, the lightly-doped source/drain regions 32 and the heavily-doped source/drain regions 34 are formed using a suitable different process sequence of known semiconductor fabrication techniques. In still other embodiments, lightly-doped source/drain regions 32 are 30 omitted. In yet other embodiments, other known S/D configurations are employed within the scope and spirit of the present disclosure.

In the illustrative embodiment, transistors 70 are shown separated by shallow trench isolation regions 20. In other suitable embodiments, regions 20 are formed as LOCOS isolation regions 20 or other isolation regions employing any suitable known isolation technique.

In the illustrative embodiment, the integrated circuit and semiconductor substrate or wafer 10 are shown with a minimum of detail for simplicity and ease of understanding. However, the substrate 10 is typically fabricated to improve the yield and performance of semiconductor circuits that are constructed. Therefore in some embodiments, the substrate or wafer 10 is a silicon wafer as depicted in FIG. 1. Alternatively, the substrate 10 may have other forms, such as a wafer and an epitaxial silicon layer (not shown) formed on the wafer.

In some embodiments, the substrate has doped well regions (not shown) formed into the substrate body. Doped well regions are formed using a suitable process of many conventional doping processes. The choice of substrate and a specific substrate structure is a design choice so that any suitable substrate is within the scope and spirit of the present invention.

The specific structures shown in the illustrative embodiment are selected for simplicity and facility of understanding. The transistors 70 are illustrative of any type of semiconductor device. The gate electrodes 40 and source/drain regions 30 are formed in any suitable known electrode and region configuration of known materials using known fabrication and doping parameters.

Figure 2:
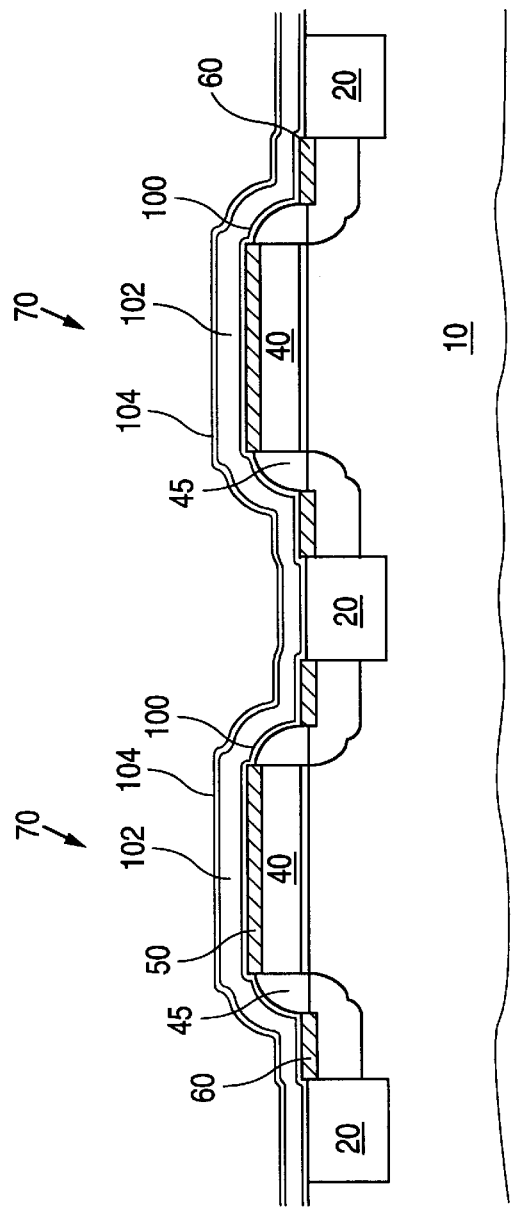

Referring to FIG. 2, a simplified cross-sectional view of an integrated circuit shows the two transistors depicted in FIG. 1 at a subsequent fabrication step. A first insulating layer 100 is shown overlying substrate 10 and particularly isolation regions 20, silicide regions 50 and 60, and spacers 45. The insulating layer 100 is optional so that other embodiments within the scope of the present invention may not include the insulating layer 100. The first optional insulating layer 100 typically is formed from an electrically-isolating material such as silicon dioxide, silicon oxide, or other known insulating materials and has a thickness of 10 nanometers (nm) or less. Most typically, the insulating layer 100 has a thickness between approximately 3 and 8 nm. The insulating layer 100 is typically formed using conventional chemical vapor deposition (CVD) or plasma-enhanced CVD (PECVD) processes. Overlying the first optional insulating layer 100 is a conductive layer 102. The conductive layer 102 is typically formed of a commonly-employed transition or refractory metal that forms a corresponding metal silicide. One example of a suitable transition or refractory metal is titanium (Ti). A layer of titanium (Ti) is deposited, for example, having a thickness ranging from approximately 40 nm to about 80 nm. The thicknesses, for example 10 nm to 1000 nm, may be suitable in some embodiments. In integrated circuit embodiments in which the first optional insulating layer 100 is not employed, the conductive layer 102 is essentially in direct contact with the substrate 10 in regions in which other native oxides are not present.

In some embodiments, a second optional insulating layer 104 is formed overlying the conductive layer 102. The second insulating layer 104 is typically formed from an electrically-isolating material such as silicon dioxide, silicon oxide, or other known insulating materials and is formed using the same techniques and fabrication parameters that are used to construct the first insulating layer 100. In various embodiments, the second insulating layer 104 is formed to a suitable thickness of a wide range of thicknesses. In one example, the second insulating layer 104 is approximately 10 nm thick.

In some embodiments, the first optional insulating layer 100 performs an etch-stop function and second optional insulating layer 104 performs an etch-mask function.

Referring to FIG. 3, the structure shown in FIG. 2 is illustrated following application of a photoresist layer 106. The photoresist layer 106 is patterned and the second optional insulating layer 104 and conductive layer 102 are etched to define selected local interconnect coupling regions 108 and 110, respectively. The local interconnect coupling regions 110 are left covered following patterning of the photoresist layer 106. In the illustrative embodiment, the local interconnect coupling regions 110 couple the gate electrodes 40 to one S/D region 30 of the transistors 70 through the gate silicide regions 50 and the S/D silicide regions 60. Direct contact of the local interconnect coupling regions 110 with the silicide regions 50 and 60 ensures a low resistance contact to the underlying doped region. The term local interconnect is defined herein to refer to a routing-restricted interconnect structure.

The silicide regions 50 and 60 have low sheet resistivities and are electrically coupled to respective underlying doped structures or regions so that a low resistance contact to the underlying structure advantageously results even when only a portion of the silicide regions are in direct contact with the local interconnect coupling regions 110. The layout structure ofthe local interconnect coupling region 110 is selected based on the functionality of the circuitry to be fabricated.

The etching technique or method that is used to etch the conductive layer 102 is selected based on the particular conductive material used to form the layer. The etching technique or method is also selected based on whether the first optional insulating layer 102 or the second optional insulating layer 104 are formed.

For example, if the conductive layer 102 is formed from titanium and the second optional insulating layer 104 is utilized, a two-step etch process is employed in some embodiments. In a first step, the second insulating layer 104 is etched using the photoresist layer 106 as an etch mask. In typical embodiments etching is performed using a buffered oxide etch solution. In other embodiments, a dry oxide etch is utilized. Etch-mask portions 108 are defined and selectively-patterned portions of local interconnect coupling regions 110 are advantageously etched using a sulfuric acid/hydrogen peroxide etchant. The etchant also removes remaining portions of the photoresist layer 106. In the illustrative two-step etch process, both the local interconnect patterning and photoresist removal are advantageously performed in a single operation. In some embodiments in which the etch-mask 108 is not formed, the titanium is etched using a fluorine-containing plasma. To prevent unintentional etching of underlying features during the plasma etch, first optional insulating layer 100 is used as an etch-stop layer.

Referring to FIG. 4, the integrated circuit portion shown in FIG. 3 is illustrated following removal of the photoresist layer 106 and the etch-mask 108, and following thermal annealing of the integrated circuit. Remaining local interconnects 112 are completed interconnect structures. In embodiments employing the optional insulating layers 100 shown in FIG. 2, local interconnects 112 dissolve or otherwise "break-through" the first insulating layer 100 to form a lowresistance electrical coupling of local interconnects 112 to the source/drain silicide regions 60 and gate silicide regions 50. Any remaining portions 114 of the first insulating layer 100 do not underlie a local interconnect 112 and may be either subsequently removed or allowed to remain as vestigial, nonfunctional circuit portions, if desired.

In embodiments for which titanium is used to form local interconnects 112, a thermal anneal step is advantageously performed using a rapid thermal anneal (RTA) system. A suitable rapid thermal anneal process involves heating the substrate or wafer 10 to a temperature in a range between approximately 450° C. to 680° C. for approximately 30 seconds. Titanium readily dissolves thin layers of silicon dioxide so that the use of titanium with a thermal anneal process is particularly suited to forming local interconnects 112 in the illustrative method. In some embodiments using titanium for the local interconnects 112, both the optional first insulating layer 100 and the optional second insulating layer 104 are dissolved into the titanium upon completion of a thermal anneal step. In embodiments using transition or refractory metals other than titanium, the annealing temperature range and anneal time are selected to be suitable for the selected transition or refractory metal. Suitable annealing temperature ranges and anneal times are selected based on the particular transition or refractory metal selected to form the local interconnects 112, based on whether the first optional insulating layer 100 is used, based on the maximum resistance of the contacts that are accommodated by the finished device, and based on other factors.

In some embodiments, an optional insulating layer 116 is deposited overlying the local interconnects 112. Typically, the insulating layer 116 is formed from silicon oxide, silicon dioxide or other isolating materials.

Figure 5:
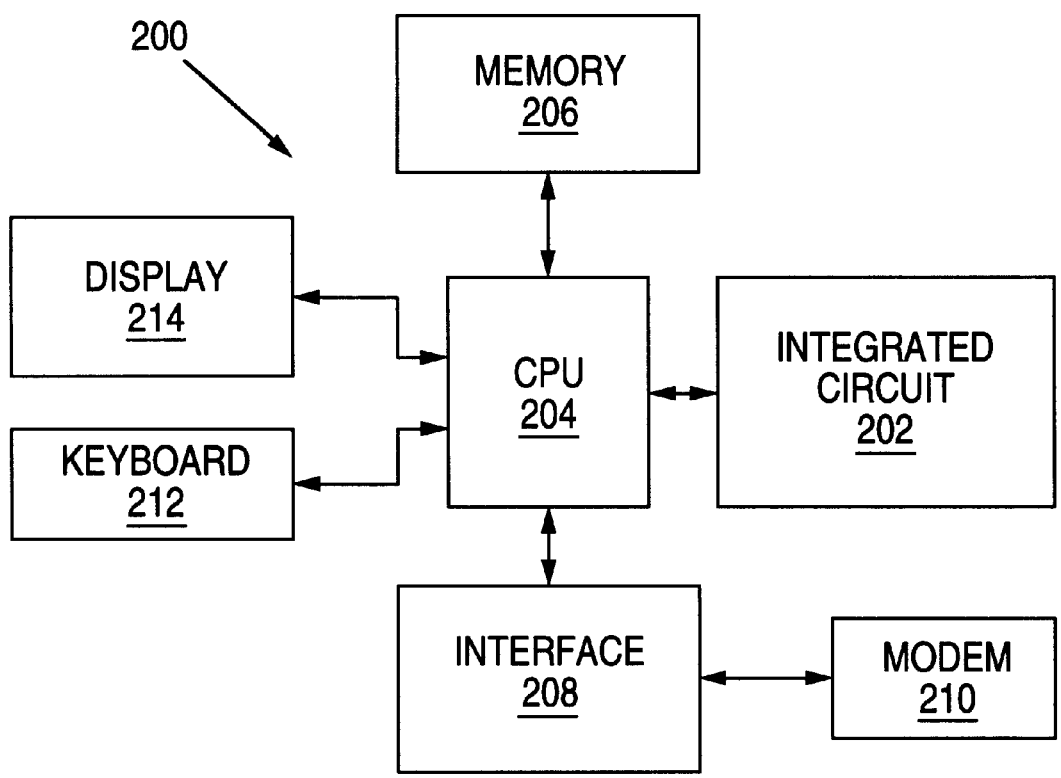
FIG. 5 is a schematic block diagram illustrating a computer system including an integrated circuit including transistors with local interconnects fabricated using a method as depicted in FIGS. 1 through 4.

Referring to FIG. 5, a computer system 400 includes an integrated circuit 402, a central processing unit 404, a memory 406, and an interface 408, connected to a modem 410. The computer system 400 also includes a keyboard 412 and a display 414 forming a user interface.

While the invention has been described with reference to various embodiments, it will be understood that these embodiments are illustrative and that the scope of the invention is not so limited. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

For example, the described method employs control of exposure to account for variations in processing parameters such as gate oxide thickness, polysilicon etch bias and rapid thermal annealing (RTA) temperature. The method is also applicable to control of exposure to account for variations in other processing parameters including variations in spacer etch, variations in temperature arising from other processing steps and processing devices and the like.

The described method and local interconnect structure offer substantial advantages over conventional methods and structures in forming a local interconnect structure that is formed with less process complexity and increases performance through reduced contact resistance to source/drain and gate regions. The reduction in process complexity advantageously results in higher yields, increased reliability and lower costs. Unlike conventional fabrication processes, embodiments of the illustrative method allow standard processing to be used to form silicided regions.

What is claimed is:

1. A method of forming a semiconductor integrated circuit comprising:

forming a semiconductor device in a semiconductor substrate, the semiconductor device having a first doped region and a second doped region;

forming a first silicided region and a second silicided region in the first doped region and the second doped region, respectively, the first and second silicide regions forming a uniform contact region for the respective first and second doped regions;

forming a first insulating layer overlying the first and second silicide regions of the semiconductor substrate;

forming a conductive layer having an uniform thickness, the conductive layer overlying the first insulating layer, the semiconductor substrate and a portion of the first and second silicide regions;

forming a second insulating layer overlying the conductive layer; and patterning the conductive layer and the second insulating layer, the conductive layer being patterned to define a local interconnect that electrically couples the first silicide region to the second silicide region.

2. A method according to claim 1 further comprising:

heating the local interconnect to a temperature in a range between approximately 450° C. and 680° C. so that a low resistance electrical contact to the first silicide region and the second silicide region is formed.

3. A method according to claim 1 wherein:

patterning the conductive layer includes using the first insulating layer as an etch-stop layer.

4. A method according to claim 1 wherein:

the first insulating layer is a silicon dioxide layer.

5. A method according to claim 1 wherein:

patterning the conductive layer includes using the second insulating layer as an etch masking layer.

6. A method according to claim 1 wherein:

the local interconnect is defined using an etch solution including sulfuric acid and hydrogen peroxide.

7. A method according to claim 1 wherein:

the second insulating layer is a silicon dioxide layer.

8. A method for forming a local interconnect in a semiconductor integrated circuit comprising:

forming a plurality of doped regions in a semiconductor wafer;

forming a plurality of silicide regions in selected ones of the plurality of doped regions;

forming a first insulating layer overlying the two or more of the plurality of the suicide regions;

depositing a layer of transition metal or refractory metal overlying the first insulating layer and at least a portion of two or more of the plurality of doped regions;

forming a second insulating layer overlying the metal layer; and patterning the metal layer and the second insulating layer, the metal layer being patterned to form a local interconnect contacting two or more of the plurality of the silicide regions.

9. A method according to claim 8 wherein:

the silicide regions form a uniform contact region for the respective ones of the plurality of doped regions.

10. A method according to claim 8 wherein:

the layer of transition metal or refractory metal is deposited to a substantially uniform thickness.

11. A method according to claim 8 wherein:

the metal layer is patterned to define a local interconnect that electrically couples a first silicide region to a second silicide region.

12. A method according to claim 8 wherein:

the metal layer is a titanium layer.

13. A method according to claim 8 further comprising:

heating the local interconnect to a temperature in a range between approximately 450° C. and 680° C. so that a low resistance electrical contact to two or more of the plurality of the silicide regions is formed.

14. A method according to claim 8 wherein:

patterning the metal layer includes using the first insulating layer as an etch-stop layer.

15. A method according to claim 8 wherein:

the first insulating layer is a silicon dioxide layer.

16. A method according to claim 8 wherein:

patterning the metal layer includes using the second insulating layer as an etch masking layer.

17. A method according to claim 8 wherein:

the local interconnect is defined using an etch solution including sulfuric acid and hydrogen peroxide.

18. A method according to claim 8 wherein:

the second insulating layer is a silicon dioxide layer.

* * * * *